United States Patent [19]

Segawa et al.

[11] Patent Number: 4,829,237
[45] Date of Patent: May 9, 1989

[54] CIRCUIT DEVICE HAVING A SELF-TESTING FUNCTION AND A TESTING METHOD THEREOF

[75] Inventors: Hiroshi Segawa; Masahiko Yoshimoto, both of Hyogo, Japan

[73] Assignee: Mitsubishi Denki Kabushiki Kaisha, Tokyo, Japan

[21] Appl. No.: 195,636

[22] Filed: May 17, 1988

[30] Foreign Application Priority Data

May 19, 1987 [JP] Japan .................................. 62-122012

[51] Int. Cl.$^4$ ...................... G01R 31/28; G01R 31/00
[52] U.S. Cl. ............................. 324/73 R; 324/73 AT; 324/158 R; 371/25; 371/15
[58] Field of Search ............ 324/73 AT, 73 R, 158 R; 437/8; 371/21, 15, 16, 25

[56] References Cited

U.S. PATENT DOCUMENTS

| | | | |
|---|---|---|---|
| 4,504,784 | 3/1985 | Goel et al. ..................... | 324/73 R X |
| 4,635,261 | 1/1987 | Anderson et al. ................ | 371/25 X |
| 4,728,883 | 3/1988 | Green ......................... | 324/150 R X |

OTHER PUBLICATIONS

Tsui, Frank F., LSI/VLSI Testability Design. McGraw-Hill Inc., 1987: pp. 102-109.
Mead, Carver et al, Introduction to VLSI Systems. Addison-Wesley Publishing Co., Inc., 1980: pp. 75-76.

Primary Examiner—Reinhard J. Eisenzopf
Assistant Examiner—Vinh P. Nguyen
Attorney, Agent, or Firm—Lowe, Price, LeBlanc, Becker & Shur

[57] ABSTRACT

A semiconductor integrated circuit has a plurality of circuits (2 and 5) to be tested for verification of operation thereof and first, second and third scanning registers (1, 4 and 6) to be used for self-testing, and it further has a register (3) for delay. In operation, predetermined test data is inputted to each of the first and second scanning registers (1 and 4) and then the first and second circuits (2 and 5) to be tested process those data simultaneously. Thus, testing time is saved. Although the time required for processing in the first circuit (2) to be tested is shorter than that in the second circuit (5) to be tested, the processed data can be obtained simutaneously by the delay function of the register (3).

9 Claims, 7 Drawing Sheets

CIRCUIT DEVICE HAVING A SELF-TESTING FUNCTION AND A TESTING METHOD THEREOF

BACKGROUND OF THE INVENTION

1. Field of the Invention

The present invention relates to a circuit device having a self-testing function, and a testing method thereof. Particularly, it relates to a circuit device and a testing method thereof by which a plurality of circuits to be tested contained in the device can be tested for a short period of time.

2. Description of the Prior Art

In a semiconductor integrated circuit such as a digital signal processor for receiving and processing an externally applied digital signal, it is necessary to verify operation thereof. Tests for such verification are usually conducted at the time of debugging before manufacturing of semiconductor integrated circuits or at the time of verification of performance before shipment. In such a test in general, a circuit to be tested is operated after predetermined data has been inputted thereto and it is determined based on data outputted therefrom whether the circuit is normally operated or not.

FIG. 1 is a block diagram showing an example of connection in a conventional semiconductor integrated circuit including two circuits to be tested. This semiconductor integrated circuit 8 includes as the two circuits to be tested a first circuit 2 and a second circuit 5. A test is performed by using three scanning registers in the integrated circuit 8, i.e., a first scanning register 1, a second scanning register 4 and a third scanning register 6.

Referring to FIG. 1, a serial input terminal 83 of the integrated circuit 8 is connected to a serial input terminal 13 of the first scanning register 1. On the other hand, parallel input terminals 81 of the integrated circuit 8 are connected to parallel input terminals 1 of the first scanning register 1. Parallel output terminal 12 of the first scanning register 1 are connected to parallel input terminals 21 of the first circuit 2 to be tested. Parallel output terminals 22 of the first circuit 2 to be tested are connected to parallel input terminals 41 of the second scanning register 4. A serial output terminal 14 of the first scanning register 1 is connected to a serial input terminal 43 of the second scanning register 4. Parallel output terminals 42 of the second scanning register 4 are connected to parallel input terminals 51 of the second circuit 5 to be tested. parallel output terminals 52 of the second circuit 5 to be tested are connected to parallel input terminals 61 of the third scanning register 6. A serial output terminal 44 of the second scanning register 4 is connected to a serial input terminal 63 of the third scanning register 6. Parallel output terminals 62 of the third scanning register 6 are connected to parallel output terminals 82 of the integrated circuit 8. A serial output terminal 64 of the third scanning register 6 is connected to a serial output terminal 84 of the integrated circuit 8.

A selection signal generator 9 generates a selection signal Sc for selecting a mode of the scanning registers and supplies it to the first, second and third scanning registers 1, 4 and 6, respectively. A clock generator 7 generates a clock signal $\phi$ for synchronously operating all of the first, second and third scanning registers 1, 4 and 6 and the first and second circuits 2 and 5 to be tested. The clock signal $\phi$ is supplied to each of those circuits.

FIG. 2 is a block diagram showing a scanning register (the first scanning register 1 as an example) used for testing of the integrated circuit of FIG. 1.

Referring to FIG. 2, the scanning register 1 comprises registers SL1 to SLn each including a selector 15 and a master-slave latch 16 connected to the corresponding parallel input terminal 11 and the corresponding parallel output terminal 12, respectively. The selector 15 of the register SL1 has two inputs i1 and i2, the one input i1 being connected to the serial input terminal 13 of the scanning register 1 and the other input i2 being connected to the corresponding one of the parallel input terminals 11 of the scanning register 1. The selection signal Sc is supplied to the selector 15. The master-slave latch 16 of the register SL1 has an input connected to an output of the selector 15 and an output connected to the corresponding one of the parallel output terminals 12 of the scanning register 1. The clock signal $\phi$ is supplied to the master-slave latch 16. The output of the register SL1 is connected to one of the inputs of the selector 15 of the register SL2. Thus, the registers SL2 to SLn are connected in the same manner as described above, except that the output of the last register SLn is connected to the serial output terminal 14 of the scanning register 1.

Now, operation of the scanning register 1 is described. The scanning register 1 operates in a parallel mode (also called an operation mode) or a serial mode (also called a shift mode) in response to the selection signal Sc. Each master-slave latch 16 receives data from the corresponding selector 15 in response to the clock signal $\phi$ of high level and stores the data in response to the clock signal $\phi$ of low level.

First, in the parallel mode, each selector 15 selectively receives data supplied to the corresponding input i2 in response to the selection signal Sc of low level instructing the parallel mode and outputs the data to the master-slave latch 16. The master-slave latch 16 latches the data outputted from the selector 15 and outputs the latched data through one of the parallel output terminals 12. Thus, in this case, the registers SL1 to SLn constitute parallel registers operating in response to the clock signal $\phi$.

On the other hand, in the serial mode, the selector 14 of the register SL1 selectively receives data supplied to the input i1 in response to the selection signal Sc of high level instructing the serial mode and outputs the data to the master-slave latch 16. The respective registers SL2 to SLn receive outputs of the master-slave latches connected at the respective preceding stages by the functioning of the respective selectors. Accordingly, in this case, the registers SL1 to SLn constitute shift registers having n master-slave latches connected serially and operating in response to the clock signal $\phi$.

FIG. 3 is a block diagram showing an example of a circuit to be tested (the first circuit 2 of FIG. 1).

Referring to FIG. 3, the circuit 2 to be tested comprise an adder 23, a register 24 and a limiter 25 which are connected serially between the parallel input terminals 21 and the parallel output terminals 22.

In operation, data is inputted to the adder 23 through the parallel input terminals 21 in response to the clock signal $\phi$. The data obtained through addition is supplied to the register 24 in response to the clock signal $\phi$ and then limiting processing is applied to the data in the limiter 25. Thus, the circuit to be tested processes the input data and outputs the data in a period of two cycles of the clock signal φ.

Description is now made of testing operation of the integrated circuit i of FIG. 1 where the scanning registers and the circuits to be tested are connected as described above.

Referring again to FIG. 1, first, the selection signal generator 9 generates a selection signal Sc of low level. All the scanning registers 1, 4 and 6 operate in the serial mode in response to the selection signal Sc. Predetermined test pattern data D1 for testing is supplied to the serial input terminal 83 of the integrated circuit 8. The first scanning register 1 stores the pattern data D1 through its serial input terminal 13 in response to the clock signal φ. Then, a selection signal Sc of high level is outputted from the generator 9 and all the scanning registers 1, 4 and 6 operate in the parallel mode. The first scanning register 1 outputs the test pattern data converted to parallel data from the parallel output terminals 12 in response to the clock signal φ. The first circuit 2 to be tested performs predetermined operation upon receipt of the parallel test pattern data through the parallel input terminals 21 and outputs the processed data in parallel from the parallel outputs terminals 22. The second scanning register 4 receives the processed data through the parallel input terminals 41 and then the generator 9 outputs a selection signal Sc of low level. The second scanning register 4 converts the processed data to serial data in response to the signal Sc and outputs the serial data from the serial output terminal 44. The third scanning register 6 receives the processed serial data through the serial input terminal 63 and outputs the data from the serial output terminal 64. The data is outputted from the serial output terminal 84 of the integrated circuit 8. The predetermined test pattern data D1 supplied to the serial input terminal 83 and the processed data outputted from the serial output terminal 84 are analyzed, so that it can be verified whether the first circuit 2 to be tested operates normally or not.

After the normal operation of the first circuit 2 has been verified, operation of the second circuit 5 is verified in the same manner. More specifically, predetermined test pattern data D2 supplied through the serial input terminal 83 is supplied to the second scanning register 4 through the first scanning register 1. The second scanning register 4 converts the data D2 to parallel data and then supplies it to the second circuit 5 to be tested. The parallel data processed by the second circuit 5 is supplied to the scanning register 6, where it is converted to serial data. The serial data thus converted and the predetermined test pattern data D2 are analyzed.

FIG. 4 is a flow chart for explaining operation procedures in the integrated circuit of FIG. 1. This flow chart represents operation steps of the integrated shown in FIG. 1 for verifying operations of the first circuit 2 and the second circuit 5 to be tested as described above. In the following, it is assumed that an operation delay time in the first circuit 2 to be tested corresponds to three clocks and that in the second circuit 5 to be tested corresponds to four clocks. In addition, it is assumed that all the scanning registers 1, 4 and 6 have 8-bit input/output terminals. The delay time in each operation step is indicated in the figure on the right side thereof by the count number of clock signals φ.

Referring to FIG. 4, first in the step 201, all the scanning registers 1, 4 and 6 are set to the serial mode. (In other words, the selection signal generator 9 of FIG. 1 outputs the selection signal Sc of low level.) Then, in the step 202, the test pattern data D1 for the first circuit 2 to be tested is inputted serially to the first scanning register 1. The period of this procedure corresponds to eight clocks. In the step 203, the scanning registers 1, 4 and 6 are set to the parallel mode. (In other words, the selection signal Sc of high level is outputted.) In the step 204, the first circuit 2 to be tested is operated. This procedure takes three clocks. In the step 205, the scanning registers 1, 4 and 6 are set to the serial mode. (The selection signal Sc of low level is outputted.) In the step 206, the data processed by the first circuit 2 to be tested is outputted serially from the output terminal 84 through the second and third scanning registers 4 and 6. This procedure takes 15 clocks. The data from the output terminal 84 and the test pattern data D1 supplied to the input terminal 83 are analyzed, whereby operation of the first circuit 2 is verified.

Then, in the step 207, the test pattern data D2 for the second circuit to be tested is inputted serially to the second scanning register 4 through the first scanning register 1. This step takes 16 clocks. In the step 208, the scanning registers 1, 4 and 6 are set to the parallel mode. (The selection signal Sc of high level is outputted.) In the step 209, the second circuit 5 to be tested is operated. This procedure corresponds to four clocks. In the step 210, the scanning registers 1, 4 and 6 are set to the serial mode. (The selection signal Sc of low level is outputted.) In the step 211, the data processed by the second circuit 5 to be tested is outputted to the output terminal 84 through the third scanning register 6. This takes seven clocks. The data from the output terminal 84 and the test pattern data D2 supplied to the input terminal 83 are analyzed, so that operation of the second circuit 5 is verified.

As described above, in the prior art, if two or more circuits to be tested exist in an integrated circuit, verification of operation is effected individually for each circuit to be tested, i.e., for each of the first and second circuits 2 and 5 to be tested. In the above described conventional example, a period corresponding to 53 clocks in total is required for verification of the operations of the two circuits 2 and 5 to be tested. If a large number of circuits to be tested are included in the integrated circuit, a period required for verification of operation is increased in proportion to the number of circuits to be tested.

An example of the prior art of particular interest to the present invention is shown "LSI/VSLI TESTABILITY DESIGN" (pp. 102–109) by Frank F. Tusi published by McGraw-Hill, Inc. in 1987. This document indicates, concerning the Scan-Path (including Scan-In and Scan-Out), procedures in which a predetermined pattern is set in an internal register of a system and then the content of the register is read out to an external portion through testing of the system.

Another example of the prior art of particular interest is found in "INTRODUCTION TO VLSI SYSTEMS" by Carver Mead et al. published by Addison-Wesley Publishing Company, Inc. in 1980. In pages 75 and 76 of this document, transfer of data between two registers through a pipe line is described in which different data sets are processed simultaneously in the system since the registers and combinational logic circuits are connected alternately. In addition, in pages 66 and 67 of this document, fundamental operation of shift registers is described.

SUMMARY OF THE INVENTION

Therefore, an object of the present invention is to provide a circuit device including a plurality of circuit means to be tested for verification of operation thereof, which makes it possible to reduce time required for the test.

Another object of the present invention is to provide a semiconductor integrated circuit including a plurality of circuit means to be tested for verification of operation thereof, which makes it possible to reduce time required for the test.

Still another object of the present invention is to provide an testing method of a circuit device including a plurality of circuit means to be tested for verification of operation thereof, which makes it possible to reduce time required for the test.

A further object of the present invention is to provide a testing method of a semiconductor integrated circuit including a plurality of circuit means to be tested for verification of operation thereof, which makes it possible to reduce time required for the test.

Briefly stated, a circuit device in accordance with the present invention comprises: a plurality of circuits to be tested including at least one circuit operated for a different processing period; a plurality of scanning registers having parallel and serial inputs and parallel and serial outputs, and operated in response to a clock signal in either a parallel mode or a serial mode; and an output timing regulation circuit connected to the circuit to be tested operated for the different processing period to regulate output timing so that signals processed by the pairs each constituted by a circuit to be tested and a scanning register are outputted simultaneously.

In operation, a testing signal is applied externally to each of the scanning registers. All the circuits to be tested receive the testing signal and operate simultaneously. Although one or more circuits to be tested operated for the different processing periods exist, the testing signals processed are outputted simultaneously from all the pairs by the output timing regulation circuit connected thereto.

Since all the circuits to be tested are operated simultaneously and in parallel, the time required for the test is saved.

In a preferred embodiment, the present invention is applied to a semiconductor integrated circuit. Thus, testing time for verifying operation of the semiconductor integrated circuit is reduced.

A method of operating a circuit device according to the present invention comprising a plurality of circuits to be tested including at least one circuit operated for a different processing period, and a plurality of scanning registers connected to the plurality of circuits to be tested to constitute pairs and operated in either a parallel mode or a serial mode, comprises the steps of: supplying a testing signal to each of the scanning registers; operating the circuits to be tested simultaneously in all the pairs upon receipt of the testing signals from the scanning registers; and regulating output timing to enable the processed testing signals to be outputted simultaneously from all the pairs.

In operation, after the testing signals are applied externally to all the scanning registers, all the circuits to be tested are operated upon receipt thereof. Although one or more circuits to be tested operated for the different processing period exist, output timing is regulated so that the processed testing signals are simultaneously outputted from all the pairs.

Thus, since all the circuit to be tested are operated simultaneously and in parallel, time required for the test is saved.

In another preferred embodiment, the method according to the present invention is applied to a semiconductor integrated circuit. Consequently, testing time for verifying operation of the semiconductor integrated circuit is reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
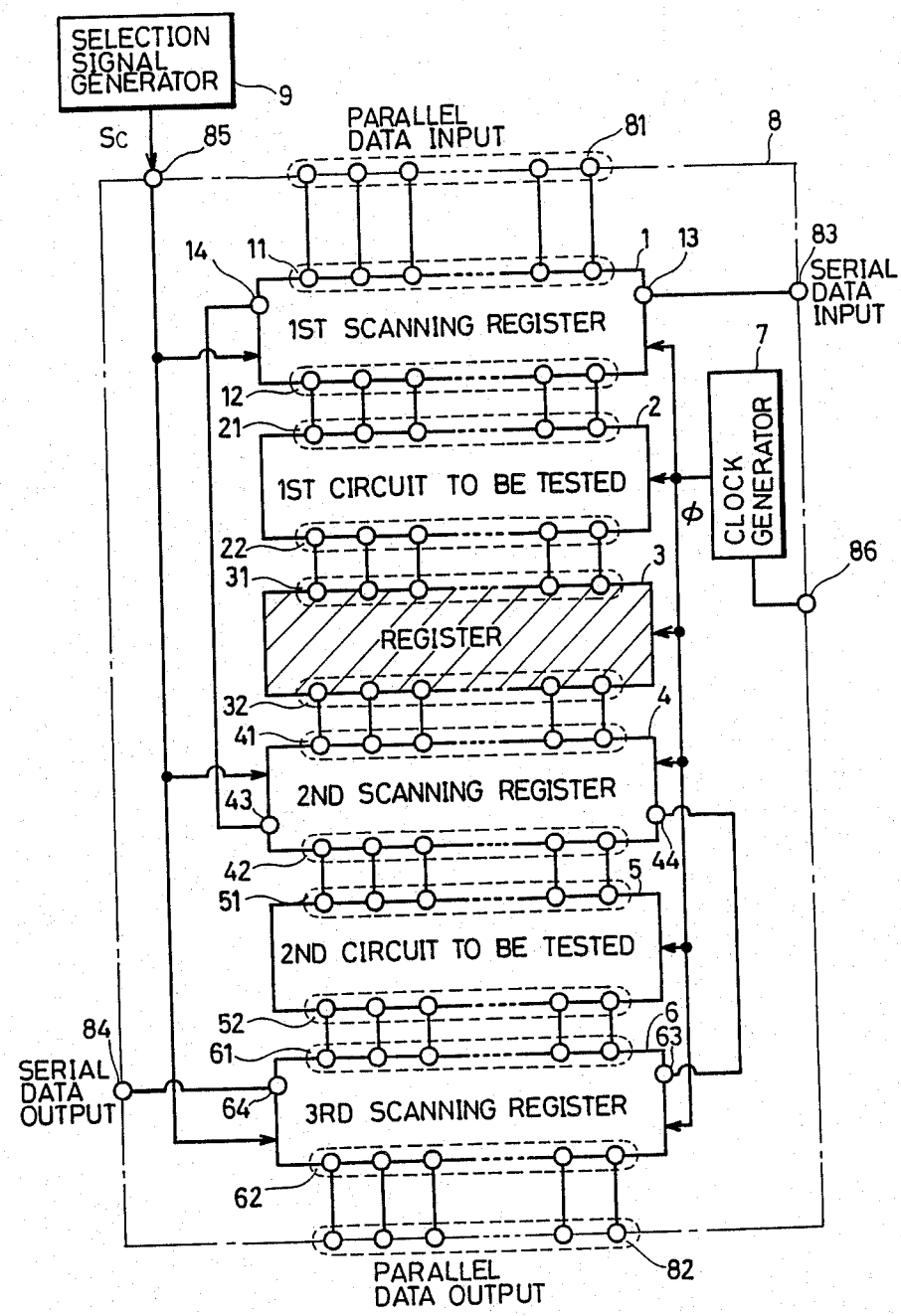
FIG. 5 is a block diagram showing connection of a semiconductor integrated circuit including two circuits to be tested according to an embodiment of the present invention.

FIG. 5 is a block diagram showing connection of a semiconductor integrated circuit including two circuits to be tested, according to an embodiment of the present invention.

Figure 1:
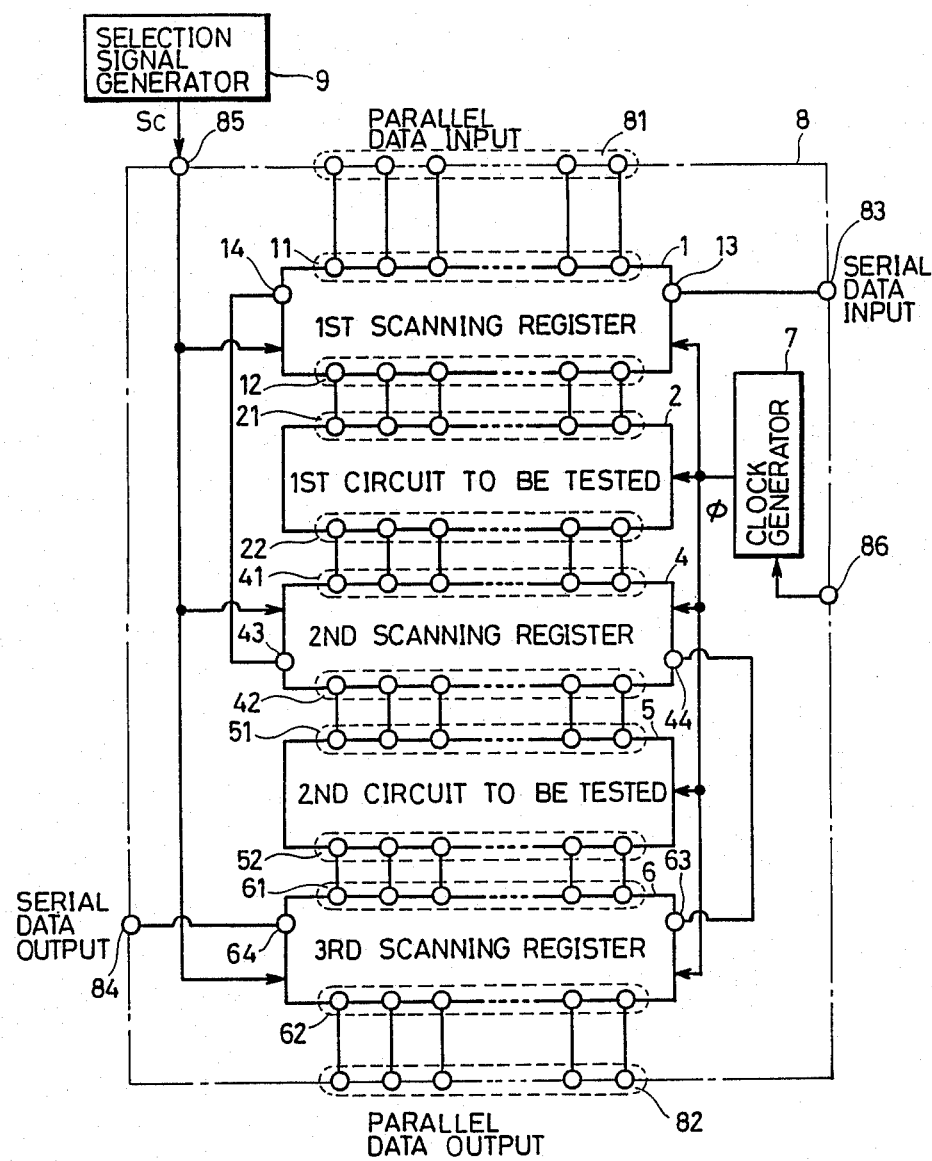
FIG. 1 is a block diagram showing connection of a conventional semiconductor integrated circuit including two circuits to be tested.
Figure 2:
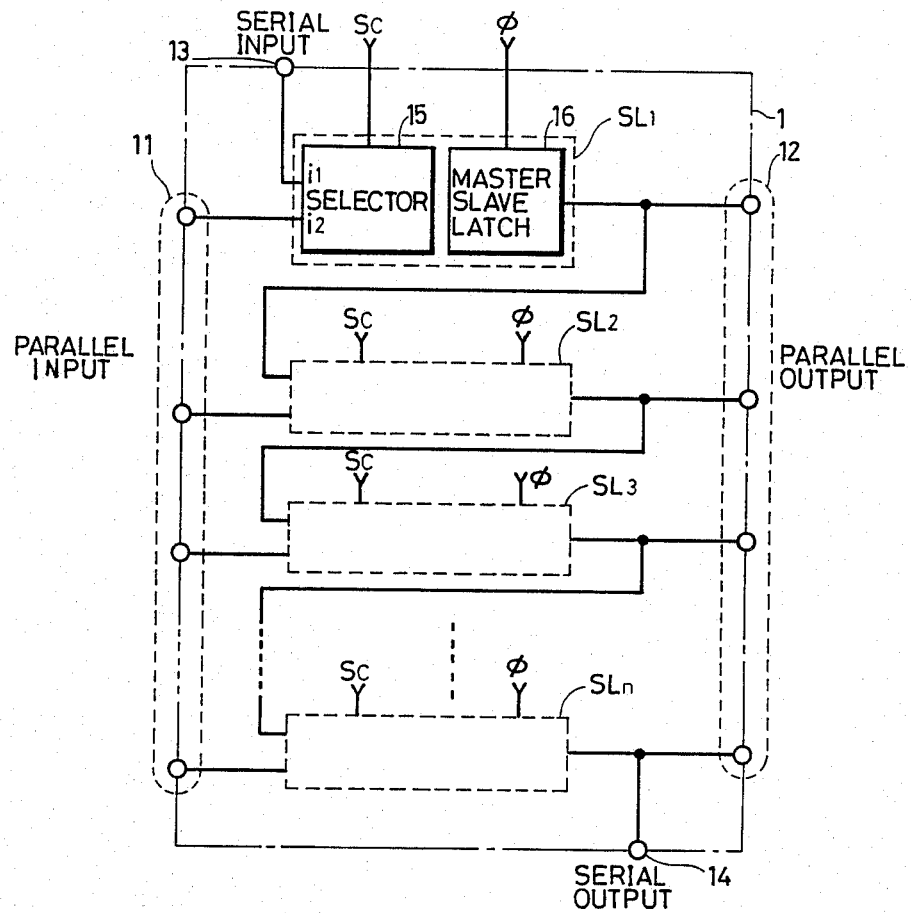
FIG. 2 is a block diagram showing a scanning register in FIG. 1.
Figure 3:
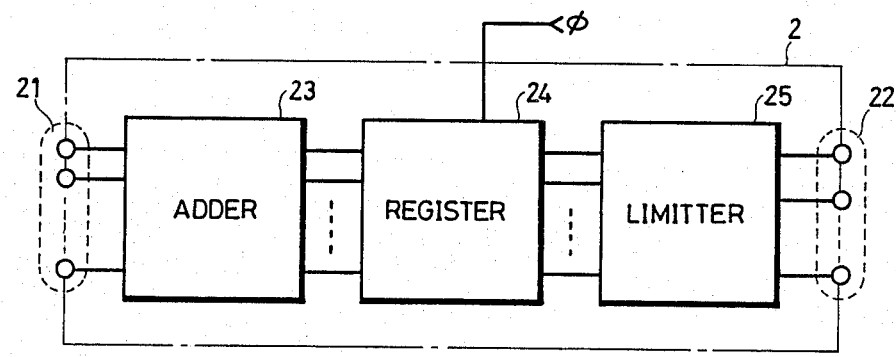
FIG. 3 is a block diagram showing an example of a circuit to be tested in FIG. 1.

Referring to FIG. 5, the semiconductor integrated circuit 8 is the same as the integrated circuit of FIG. 1, except that the semiconductor integrated circuit 8 of FIG. 5 includes a register 3 for applying delay. More specifically, the integrated circuit 8 comprises first and second circuits 2 and 5 to be tested for verification of operation thereof and first, second and third scanning registers 1, 4 and 6. The register 3 has parallel input terminals 31 and parallel output terminals 32 and it is connected between parallel output terminals 22 of the first circuit to be tested and parallel input terminals 41 of the second scanning register 4. The register 3 is connected to receive a clock signal $\phi$.

Figure 6:
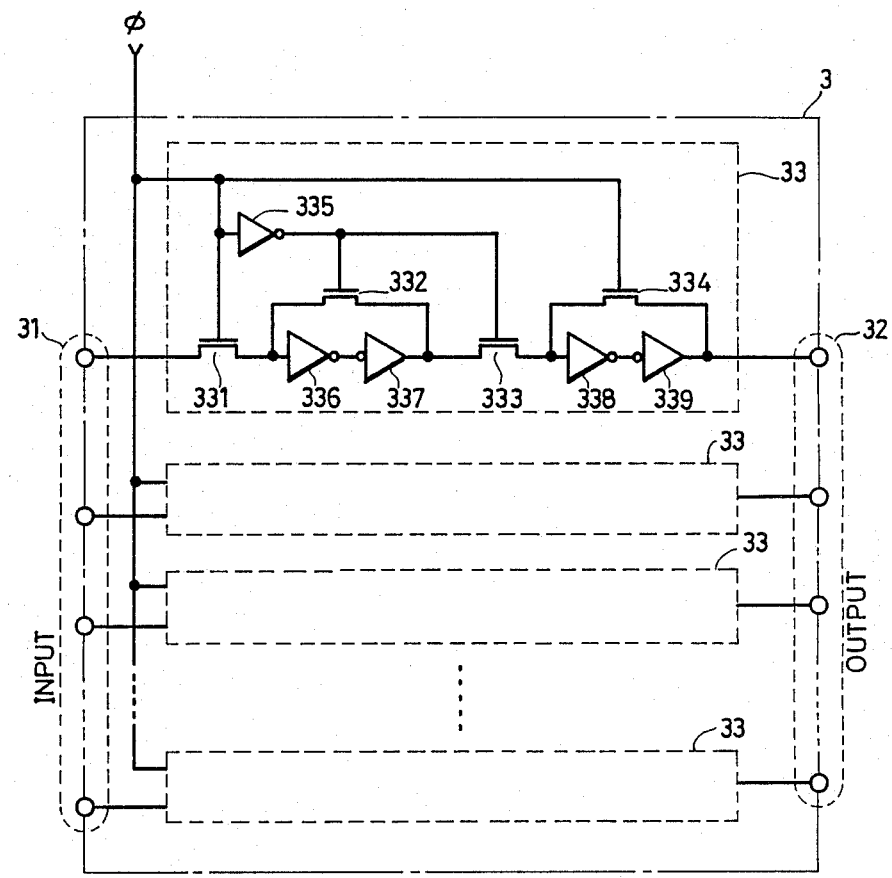
FIG. 6 is a circuit diagram showing an example of a register in FIG. 5.

FIG. 6 is a circuit diagram showing a concrete example of the register shown in FIG. 5.

Referring to FIG. 6, the register 3 comprises a plurality of shift registers 33 connected between the parallel input terminals 31 and the parallel output terminals 32 respectively. Each shift register 33 comprises a first storing circuit including a transistor 332 and two inverters 336 and 337, and a second storing circuit including a transistor 334 and two inverters 338 and 339, as well as transistors 331 and 333 and an inverter 335 for timing control connected to receive a clock signal $\phi$. The transistors in each shift register 33 are all N channel MOS transistors.

In operation, first, the transistor 331 receives an input signal from an input terminal 31 in response to the clock signal $\phi$ of high level. Then, the clock signal $\phi$ changes to low level. Since the transistor 332 is turned on in response to the inverted clock signal, the input signal is stored in the first storing circuit. At the same time, the transistor 333 is also turned on and accordingly the input signal is supplied to the inverter 338 and then outputted from an output terminal 32 through the inverter 339.

Referring again to FIG. 5, testing operation for the first and second circuits 2 and 5 is described. In the following, it is assumed in the same manner as in the case of FIG. 1 that an operation delay time in the first circuit 2 to be tested corresponds to three clocks and that in the second circuit 5 to be tested corresponds to four clocks. In addition, it is assumed that all the scanning registers 1, 4 and 6 have 8-bit input and output terminals.

First, the selection signal generator 9 outputs a selection signal Sc of low level and all the scanning registers 1, 4 and 6 are operated in the serial mode in response to the signal Sc. The predetermined test pattern data D2 for the second circuit 5 to be tested and then the predetermined test pattern data D1 for the first circuit 1 to be tested are successively inputted serially to the serial input terminal 83 of the integrated circuit 8. The test pattern data D2 is transferred serially to the second scanning register 4 through the first scanning register 1 and stored in the second scanning register 4. The test pattern data D1 is stored in the first scanning register 1. Then, a selection signal Sc of high level is outputted from the generator 9 and all the scanning registers 1, 4 and 6 are operated in the parallel mode. The scanning register 1 outputs parallel-converted test pattern data from the parallel output terminals 12 and supplies the data to the first circuit 2 to be tested. The first circuit 2 to be tested performs predetermined operation in response to the clock signal $\phi$ and outputs the processed data in parallel. The register 3 receives the processed data through the parallel input terminals 31 and stores it for a predetermined period (corresponding to one clock in this example) and then it outputs the data in parallel from the parallel output terminals 32 to the second scanning register 4.

On the other hand, when the first circuit 2 to be tested performs the predetermined operation, the second circuit 5 to be tested performs operation at the same time. More specifically, the second circuit 5 to be tested receives the parallel-converted test pattern data from the second scanning register 4 and performs predetermined operation in response to the clock signal $\phi$. The processed data outputted from the second circuit 5 to be tested is inputted in parallel to the third scanning register 6.

After the processed data are stored in the second and third scanning registers 4 and 6, the selection signal generator 9 outputs a selection signal Sc of low level. The second and third scanning registers 4 and 6 are both operated in the serial mode so that the stored data are outputted. The data stored in the third scanning register 6 is outputted serially from the output terminal 84. Subsequently, the data stored in the second scanning register 4 is outputted serially from the output terminal 84 through the third scanning register 6. The data thus outputted serially and the test pattern data D1 and D2 are analyzed, whereby it is verified whether the first and second circuits 2 and 5 are operated normally or not.

Figure 4:
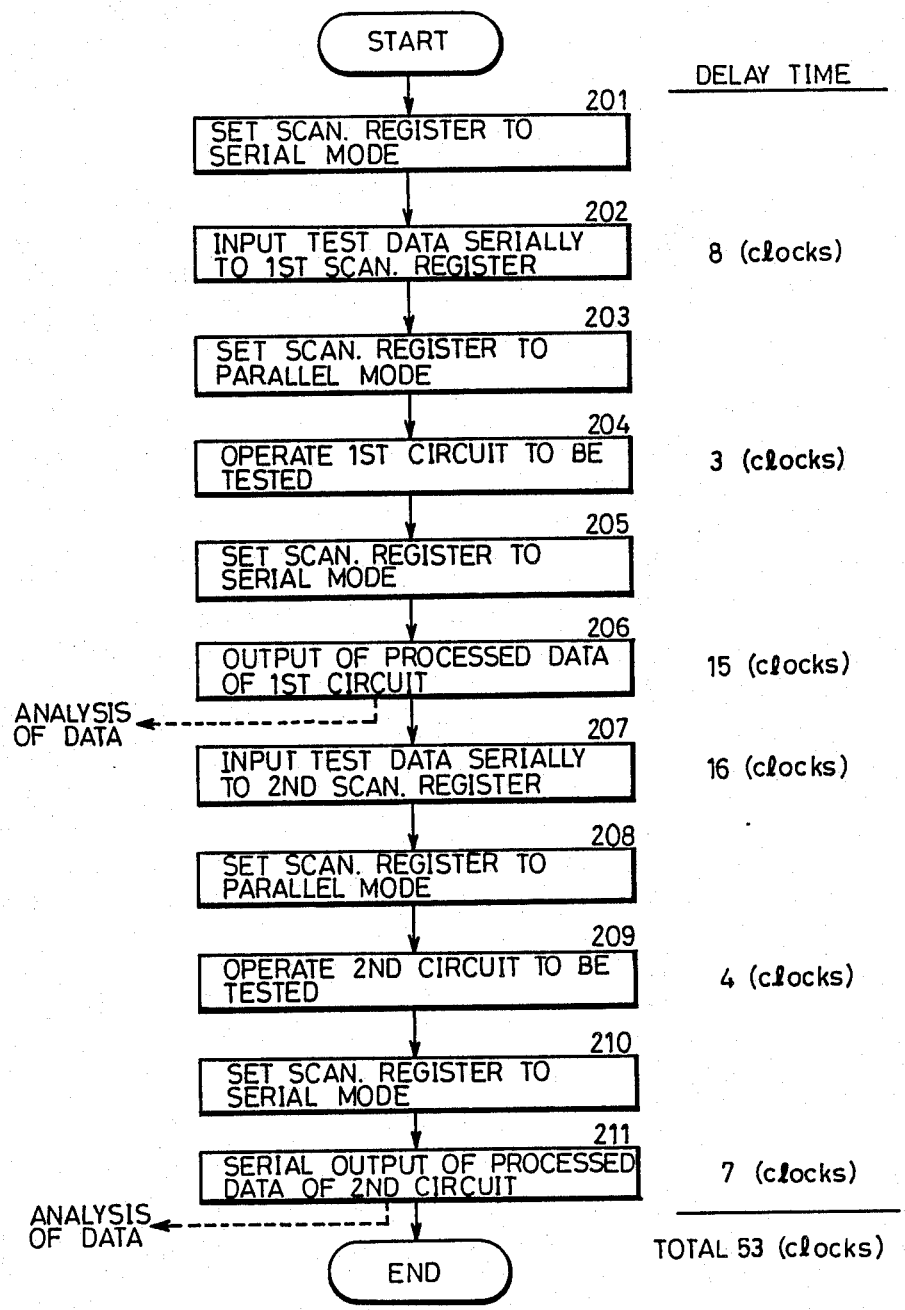
FIG. 4 is a flow chart showing testing procedures in the semiconductor integrated circuit shown in FIG. 1.
Figure 7:
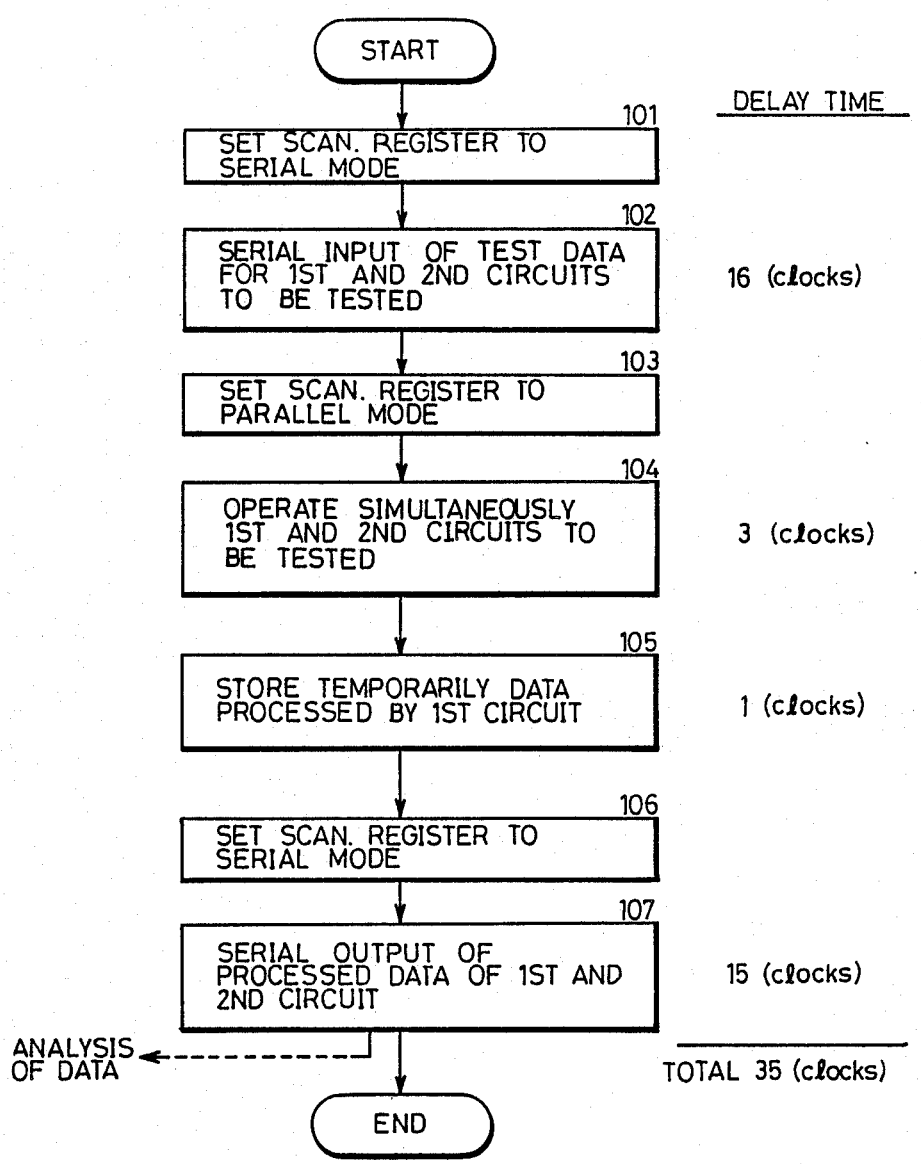
FIG. 7 is a flow chart according to another embodiment of the present invention, showing testing procedures in the semiconductor integrated circuit shown in FIG. 5.

FIG. 7 is a flow chart for explaining operation procedures of the integrated circuit of FIG. 5. Delay times in the respective steps are shown on the right side thereof by the count number of clock signals $\phi$ in the same manner as in FIG. 4.

Referring to FIG. 7, first in the step 101, all the scanning registers 1, 4 and 6 are set to the serial mode. (A selection signal Sc of low level is outputted.) Then, in the step 102, the test pattern data D1 and D2 for the first and second circuits 2 and 5 to be tested, respectively, are inputted serially. This procedure takes 16 clocks. In the step 103, the scanning registers 1, 4 and 6 are set to the parallel mode. (A selection signal Sc of high level is outputted.) In the step 104, the first and second circuits 2 and 5 to be tested are operated at the same time. Three clocks are required for operation of the first circuit 2 to be tested, while four clocks are required for operation of the second circuit 5 to be tested. In the step 105, the data processed by the first circuit 2 to be tested is stored in the register 3 for a period of one clock. Accordingly, the steps 104 and 105 take four clocks in total and the data processed simultaneously in the first and second circuits 2 and 5 are obtained simultaneously. In the step 106, the scanning registers 1, 4 and 6 are set to the serial mode. (A selection signal Sc of low level is outputted.) In the step 107, the two processed data are outputted serially from the output terminal 84. This procedure takes 15 clocks. The two data together with the test pattern data D1 and D2 supplied to the input terminal 83 are analyzed. The time required in all those steps is 35 clocks in total, which is decreased compared with the case of FIG. 4.

Thus, in the above described embodiment, the time required for the test is reduced since the first and second circuits 2 and 5 to be tested are operated simultaneously. In addition, the second and third scanning registers 4 and 6 receive the processed data simultaneously through the operation of the register 3 and accordingly those data can be synchronously handled and outputted in response to the clock signal $\phi$.

In the above described embodiment, the case of connecting the register 3 between the first circuit 2 to be tested and the second scanning register 4 was described. However, needless to say, the register 3 may be connected between the first scanning register 1 and the first circuit 2 to be tested.

In addition, although the above described embodiment relates to a semiconductor integrated circuit, the present invention is not limited thereto. More specifically, the present invention is applicable to verify operation of a plurality of semiconductor integrated circuits (used in a print circuit board for example).

Further, although the case of the two circuits to be tested was described above, the present invention is applicable to other cases of using more than two circuits to be tested provided by suitable increase of the number of the registers 3.

Figure 8:
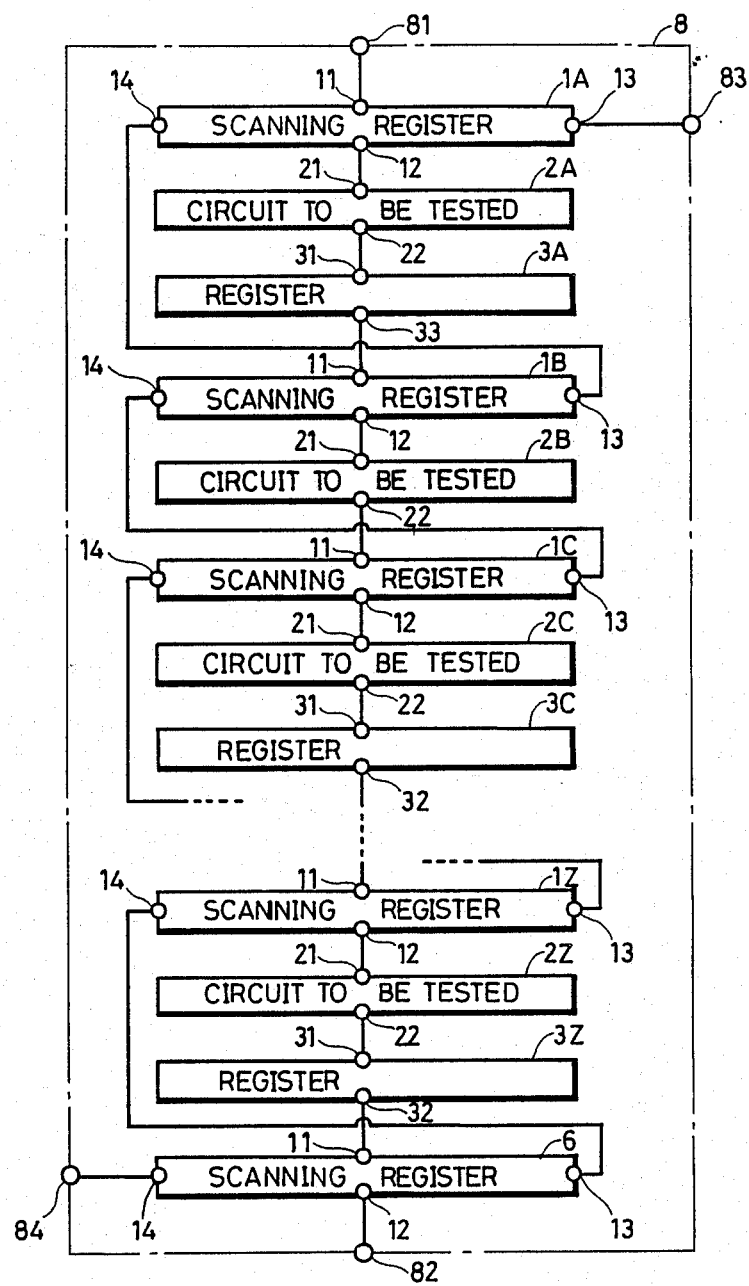
FIG. 8 is a block diagram showing simplified connection where the present invention is generally applied to a semiconductor integrated, including circuit more than two circuits to be tested.

FIG. 8 is a block diagram showing simplified connection by which the present invention is generally applied to the case of using more than two circuits to be tested in a semiconductor integrated circuit.

Referring to FIG. 8, the semiconductor integrated circuit 8 comprises circuits 2A to 2Z to be tested having different processing periods, a plurality of scanning registers 1a to 1z connected thereto, and registers 3A, 3C and 3D connected to the circuits to be tested having shorter processing periods (for example, the circuits 2A, 2C and 2Z). In this figure, the parallel input and output terminals of the respective circuits are shown as a simplified manner and connections for the selection signal Sc and the clock signal $\phi$ are omitted from the illustration. From FIG. 8, it is easily understood that the present invention is applicable to a semiconductor integrated circuit having more than two circuits to be tested.

In addition, although in the previous by described embodiment of the first and second circuits 2 and 5 to be tested are operated in response to the same clock signal $\phi$, the same effect can be obtained by regulation of the delay times by means of the register 3 even if different clock signals are applied.

As described in the foregoing, the circuit device according to the present invention comprises: a plurality of circuits 2 and 5 to be tested including at least one circuit 2 operated for a different processing period; a plurality of scanning registers 1 and 4 having parallel and serial inputs and parallel and serial outputs and operating in either the parallel mode or the serial mode; and an output timing regulation circuit 3 connected to the circuits 2 and 5 to be tested operated for different processing periods to regulate output timing to output the processed signals simultaneously from the pairs each constituted by one of the circuits 2 and 5 to be tested and one of the scanning registers 1 and 4.

In operation, a testing signal is supplied externally to each of the scanning registers 1 and 4. All the circuits 2 and 5 to be tested are operated simultaneously upon receipt of the respective testing signals. Although the circuit 2 to be tested operated for the different processing period exists, the processed testing signals are outputted simultaneously from all the pairs through the output timing regulation circuit 3 connected thereto. Since all the circuits to be tested are operated simultaneously and in parallel, the time required for the test is saved.

The method of operating the circuit device 8 according to the present invention having the plurality of circuits 2 and 5 to be tested including the circuit 2 operated for the different processing period, and the plurality of scanning registers 1 and 4 connected to the circuits 2 and 5 to be tested to constitute pairs and operating in either the parallel mode or the serial mode, comprises the steps of: applying the testing signals to all the scanning registers 1 and 4 (steps 101 and 102), operating simultaneously the circuits 2 and 5 to be tested in all the pairs upon receipt of the testing signals from the scanning registers (steps 103 and 104), and regulating output timing so that the processed testing signals are outputted simultaneously from all the pairs (step 105).

In operation, after the testing signals are supplied externally to all the scanning registers 1 and 4, all the circuits 2 and 5 to be tested are operated upon receipt of the testing signals. Although the circuit 2 operated for the different processing period exists, output timing is regulated so that the processed testing signals are outputted simultaneously from all the pairs. Accordingly, since all the circuits to be tested are operated simultaneously and in parallel, the time required for the test is saved.

In the preferred embodiment, the present invention is applied to a semiconductor integrated circuit as the circuit device. Thus, the testing time required for verifying operation of the semiconductor integrated circuit is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit device (8) having a self-testing function, comprising:

a plurality of circuit means (2 and 5) to be tested for verification of operation thereof, at least one circuit means (2) out of said plurality of said circuit means (2 and 5) being operated for a processing period different from that of the other circuit means (5);

a plurality of scanning register means (1 and 4) having parallel inputs (11 and 41) for receiving a parallel input signal, parallel outputs (12 and 42) for outputting a parallel output signal, serial inputs (13 and 43) for receiving a serial input signal and serial outputs (14 and 44) for outputting a serial output signal, and being operated in response to a clock signal, the respective ones of said plurality of circuit means (2 and 5) to be tested being connected with the corresponding ones of said plurality of scanning register means (1 and 4) to constitute a plurality of pairs;

means (9) for setting an operation mode of said plurality of scanning register means (1 and 4) to either a parallel mode or a serial mode, said scanning register means (1 and 4) storing the parallel input signal applied to the parallel inputs (11 and 41) in response to a clock signal when the operation mode is set to the parallel mode, and outputting the stored parallel signal from the parallel outputs (12 and 42), said scanning register means (1 and 4) storing the serial input signal applied to the serial inputs (13 and 43) in response to the clock signal when the operation mode is set to the serial mode and outputting the stored serial signal from the serial outputs (14 and 44), said scanning register means (1 and 4) being connected to receive an externally applied test signal in each of said pairs, said circuit means (2 and 5) to be tested, being connected to receive said externally applied test signal through said scanning register means (1 and 4) to process the test signal in response to the clock signal and to output the processed test signal; and output timing regulation means (3) connected to the output of said circuit means (2) to be tested, and to said input of said scanning register means (4) operated for the different processing period, for regulating output timing to enable the processed test signals to be simultaneously outputted from all the circuit means (2 and 5) in response to the clock signal.

2. A circuit device having a self-testing function in accordance with claim 1, wherein said circuit device comprises a semiconductor integrated circuit (8).

3. A circuit device having a self-testing function in accordance with claim 1, wherein said output timing regulation means comprises register means (3) operated in response to the clock signal.

4. A circuit device having a self-testing function in accordance with claim 3, wherein said register means (3) is connected to receive an output signal from the circuit means (2) to be tested, operated for the different processing period.

5. A circuit device having a self-testing function in accordance with claim 4, wherein
said circuit means (2 and 5) to be tested include parallel inputs (21 and 51) for receiving a parallel input signal and parallel outputs (22 and 52) for outputting a parallel output signal,
said register means (3) includes a parallel input (31) for receiving the parallel input signal and a parallel output (32) for outputting the parallel output signal, and
the parallel input (31) of said register means (3) is connected to the parallel output (22) of the circuit means (2) to be tested, operated for the different processing period.

6. A method for operating a circuit device wherein said circuit device (8) having a self-testing function, comprising:
a plurality of circuit means (2 and 5) to be tested for verification of operation thereof, at least one circuit means (2) out of said plurality of circuit means (2 and 5) to be tested being operated for a processing period different from that of the other circuit means (5),
a plurality of scanning register means (1 and 4) having parallel inputs (11 and 41) for receiving a parallel input signal, parallel outputs (12 and 42) for outputting a parallel output signal, serial inputs (13 and 43) for receiving a serial input signal and serial outputs (14 and 44) for outputting a serial output signal, and being operated in response a clock signal, and
means (8) for setting an operation mode of said plurality of scanning register means (1 and 4) to either a parallel mode or a serial mode,
said scanning means (1 and 4) storing the parallel input signal applied to the parallel inputs (11 and 41) in response to the clock signal when the operation mode is set to the parallel mode, and outputting the stored parallel signal from the parallel outputs (12 and 42),
said scanning register means (1 and 4) storing the serial input signal applied to the serial inputs (13 and 43) in response to the clock signal when the operation mode is set to the serial mode, and outputting the stored serial signal from the serial outputs (14 and 44), and
the respective ones of said plurality of circuit means (2 and 5) to be tested being connected with the corresponding ones of said plurality of scanning register means (1 and 4) to constitute a plurality of pairs,
said output timing regulation means (3) connected to the output of said circuit means (2) to be tested and to said input of said scanning register means (4), operated for different processing period, for regulating output timing to enable the processed test signals to be simultaneously outputted from all the circuit means (2 and 5) in response to the clock signal method of operating said circuit device, comprising:
the step (102) of supplying predetermined test data to each of said plurality of scanning register means (1 and 4) in all of said pairs,
the step (104) of simultaneously operating said circuit means (2 and 5) to be tested in all of said pairs in response to the clock signal upon receipt of said predetermined test data signal from said scanning register means (1 and 4), and
the step (105) for regulating output timing to output simultaneously the processed test data from all of the pairs.

7. A method of operating the circuit device in accordance with claim 6, wherein said circuit device comprises a semiconductor integrated circuit (8).

8. A method of operating the circuit device in accordance with claim 6, wherein
the step of supplying the predetermined test data to each of said plurality of scanning register means (1 and 4) comprises
the step (101) of setting said plurality of scanning register means (1 and 4) to the serial mode, and
the step (102) of successively inputting serially the predetermined test data to said plurality of scanning register means (1).

9. A method of operating the circuit device in accordance with claim 6, wherein
the step of simultaneously operating said circuit means (2 and 5) to be tested in all of said pairs comprises
the step (103) of setting said plurality of scanning register means (1 and 4) to the parallel mode, and
the step (104) of simultaneously operating said plurality of circuit means (2 and 5) to be tested in response to the clock signal when said plurality of circuit means (2 and 5) to be tested receive said predetermined test data converted to parallel data from said plurality of scanning register means (1 and 4).

* * * * *